US009915009B2

(12) United States Patent
Koshi et al.

(10) Patent No.: US 9,915,009 B2
(45) Date of Patent: Mar. 13, 2018

(54) METHOD FOR GROWING BETA-GA2O3-BASED SINGLE CRYSTAL, AND BETA-GA2O3-BASED SINGLE CRYSTAL SUBSTRATE AND METHOD FOR PRODUCING SAME

(71) Applicants: TAMURA CORPORATION, Tokyo (JP); KOHA CO., LTD., Tokyo (JP)

(72) Inventors: Kimiyoshi Koshi, Tokyo (JP); Shinya Watanabe, Tokyo (JP)

(73) Assignees: TAMURA CORPORATION, Tokyo (JP); KOHA CO., LTD., Tokyo (JP)

(*) Notice: Subject to any disclaimer, the term of this patent is extended or adjusted under 35 U.S.C. 154(b) by 51 days.

(21) Appl. No.: 14/890,723

(22) PCT Filed: May 2, 2014

(86) PCT No.: PCT/JP2014/062193
§ 371 (c)(1),
(2) Date: Nov. 12, 2015

(87) PCT Pub. No.: WO2014/185302
PCT Pub. Date: Nov. 20, 2014

(65) Prior Publication Data
US 2016/0122899 A1    May 5, 2016

(30) Foreign Application Priority Data
May 13, 2013   (JP) .................. 2013-101428

(51) Int. Cl.
C30B 15/34    (2006.01)
C30B 29/16    (2006.01)
C30B 15/36    (2006.01)

(52) U.S. Cl.
CPC .............. *C30B 15/34* (2013.01); *C30B 15/36* (2013.01); *C30B 29/16* (2013.01)

(58) Field of Classification Search
CPC combination set(s) only.
See application file for complete search history.

(56) References Cited

U.S. PATENT DOCUMENTS 5,885,344 A * 3/1999 Kim ..................... C30B 15/14
                                                                117/13
2014/0121755 A1   8/2014   Sasaki
2014/0217554 A1   8/2014   Sasaki
2014/0352604 A1  12/2014   Koshi et al.
2016/0032485 A1   2/2016   Watanabe et al.

FOREIGN PATENT DOCUMENTS

CN    101320780 A   12/2008
CN    103781948 A    5/2014
(Continued)

OTHER PUBLICATIONS

Machine translation of JP2006-312571.*
(Continued)

*Primary Examiner* — Duy Vu N Deo
*Assistant Examiner* — Erin F Bergner
(74) *Attorney, Agent, or Firm* — Scully, Scott, Murphy & Presser, P.C.

(57) ABSTRACT

Provided is one embodiment which is a method for growing a $\beta$-$Ga_2O_3$-based single crystal including contacting a flat plate-shaped seed crystal with a $Ga_2O_3$-based melt, and pulling up the seed crystal such that a flat plate-shaped $\beta$-$Ga_2O_3$-based single crystal having a principal surface which intersects a surface is grown without inheriting a crystal information of a vaporized material of the $Ga_2O_3$-based melt adhered to the principal surface of the seed crystal, wherein when growing the $\beta$-$Ga_2O_3$-based single crystal, a shoulder of the $\beta$-$Ga_2O_3$-based single crystal is widened in a thickness direction (t) thereof.

18 Claims, 14 Drawing Sheets

(56) References Cited

FOREIGN PATENT DOCUMENTS

| CN | 105102694 A | 11/2015 |
|---|---|---|
| EP | 2 801 645 A1 | 11/2014 |
| JP | 2006-312571 A | 11/2006 |
| JP | 2006-335616 A | 12/2006 |
| JP | 2013-082587 A | 5/2013 |
| WO | 2013/035464 A1 | 3/2013 |

OTHER PUBLICATIONS

Aida, et al., "Growth of β-Ga2O3 Single Crystals by the Edge-Defined, Film Fed Growth Method", Japanese Journal of Applied Physics, vol. 47, No. 11, Jan. 1, 2008, pp. 8506-8509, XP008175225.

Extended European Search Report dated Dec. 9, 2016 received in related application EP 14797616.1.

Encarnacion G. Villora et al., "Large-size β-Ga2O3 single crystals and wafers", Journal of Crystal Growth, Aug. 27, 2004, vol. 270, Issues 3-4, pp. 420-426.

Japanese Official Action dated Mar. 14, 2107 received from the Japanese Patent Office in related application JP-2015-254648 together with partial English translation.

International Search Report dated Jun. 10, 2014 issued in PCT/JP2014/062193.

Japanese Office Action dated Feb. 10, 2015 issued in JP 2013-101428, together with partial translation.

Chinese Office Action dated Sep. 4, 2017 received in Chinese Patent Application No. 201480026184.7, together with an English-language translation.

* cited by examiner

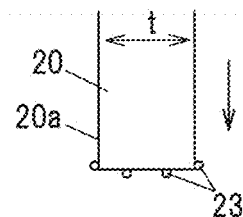
FIG.4A
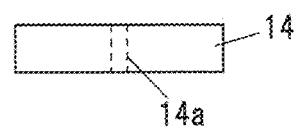
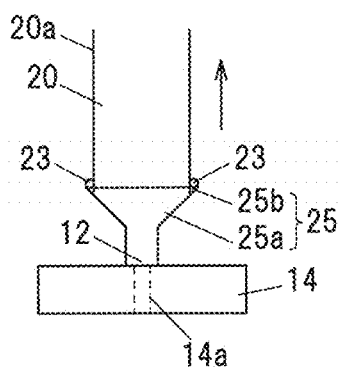
FIG.4B
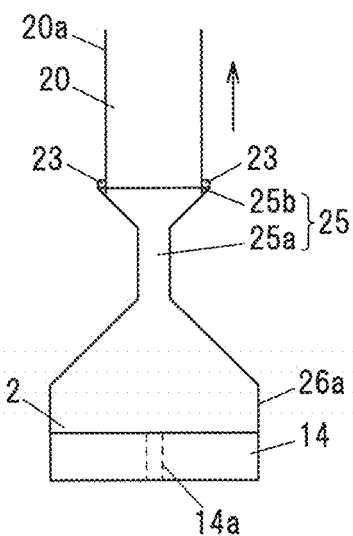
FIG.4C

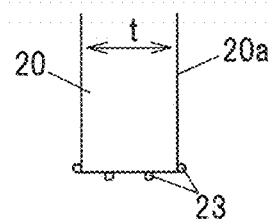
FIG.5A
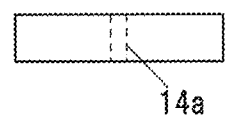
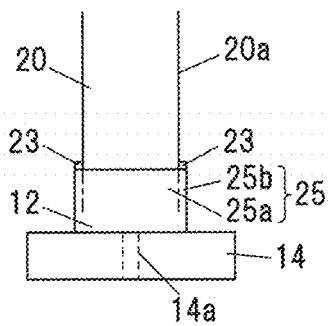
FIG.5B
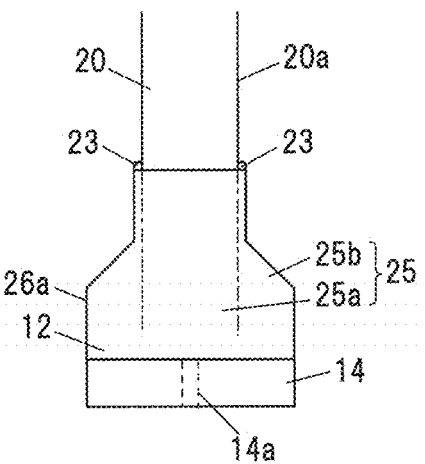
FIG.5C

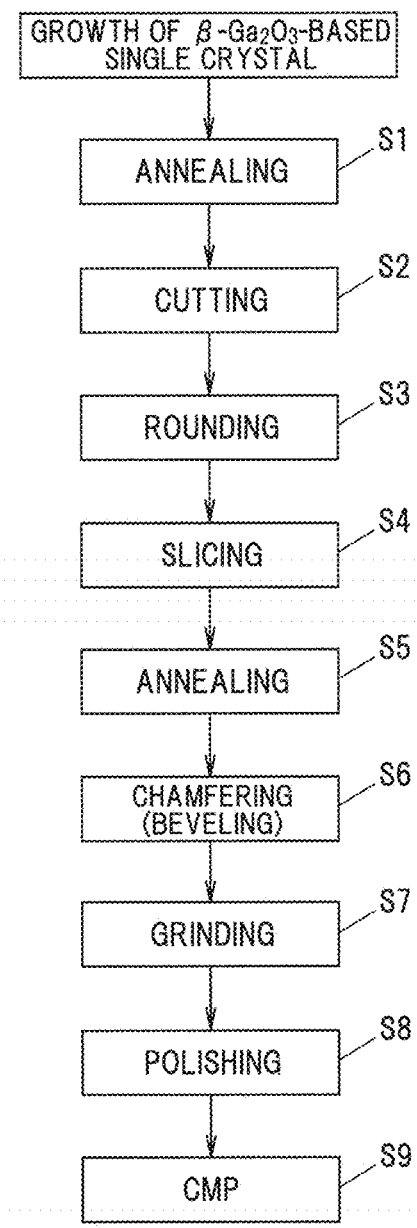

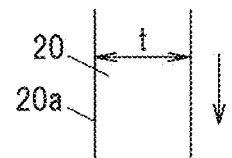
FIG.13A
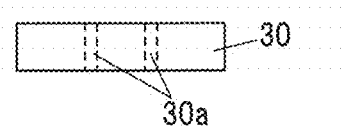
FIG.13B
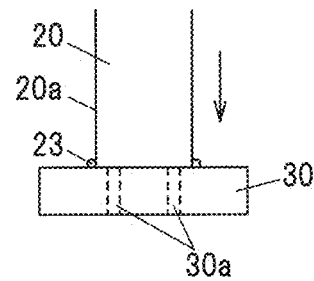
FIG.13C
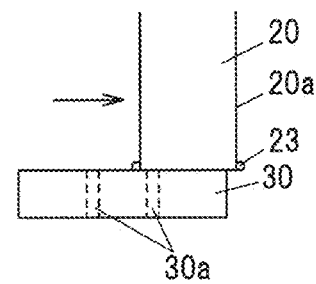

METHOD FOR GROWING BETA-GA2O3-BASED SINGLE CRYSTAL, AND BETA-GA2O3-BASED SINGLE CRYSTAL SUBSTRATE AND METHOD FOR PRODUCING SAME

TECHNICAL FIELD

The invention relates to a method for growing a β-$Ga_2O_3$-based single crystal, a β-$Ga_2O_3$-based single crystal substrate and a method for producing the substrate.

BACKGROUND ART

Use of EFG technique to grow a $Ga_2O_3$ single crystal is known as a conventional method (see e.g., PTL 1). The method disclosed in PTL 1 in which a $Ga_2O_3$ single crystal is grown while gradually widening thereof from a contact portion with a seed crystal toward the bottom, i.e., while widening the shoulder allows obtainment of a flat plate-shaped crystal having a larger width than the seed crystal.

CITATION LIST

Patent Literature

[PTL 1]
JP-A 2006-312571

SUMMARY OF INVENTION

Technical Problem

The method disclosed in PTL 1, however, has a problem that the $Ga_2O_3$ single crystal is likely to be twinned during the process of widening the shoulder. Also, if a wide flat plate-shaped seed crystal is used to eliminate the shoulder widening process, it is highly probable that the $Ga_2O_3$ single crystal to be grown is partially polycrystallized or crystal quality decreases.

Thus, it is an object of the invention to provide a method for growing a β-$Ga_2O_3$-based single crystal which allows obtainment of a flat plate-shaped β-$Ga_2O_3$-based single crystal having high crystal quality. In addition, another object is to provide a method for producing a β-$Ga_2O_3$-based single crystal substrate from a β-$Ga_2O_3$-based single crystal grown by the above-mentioned growth method. Still another object is to provide a method for producing a β-$Ga_2O_3$-based single crystal substrate, in which the β-$Ga_2O_3$-based single crystal grown by the above-mentioned growth method is used as a seed (a seed crystal) and a new β-$Ga_2O_3$-based single crystal grown from such a seed is processed into a substrate. Furthermore, another object is to provide β-$Ga_2O_3$-based single crystal substrates produced by these production methods.

Solution to Problem

According to one embodiment of the invention, a method for growing a $Ga_2O_3$-based single crystal set forth in [1] to [6] below is provided so as to achieve the above object.
[1] A method for growing a β-$Ga_2O_3$-based single crystal, comprising:
 contacting a flat plate-shaped seed crystal with a $Ga_2O_3$-based melt; and
 pulling up the seed crystal such that a flat plate-shaped β-$Ga_2O_3$-based single crystal comprising a principal surface that intersects a (100) plane is grown without inheriting a crystal information of a vaporized material of the $Ga_2O_3$-based melt adhered to the principal surface of the seed crystal,
 wherein, when growing the β-$Ga_2O_3$-based single crystal, a shoulder of the β-$Ga_2O_3$-based single crystal is widened only in a thickness direction thereof.
[2] The method for growing a β-$Ga_2O_3$-based single crystal according to [1], wherein the β-$Ga_2O_3$-based single crystal is grown in a b-axis direction.
[3] The method for growing a β-$Ga_2O_3$-based single crystal according to [2], wherein the β-$Ga_2O_3$-based single crystal comprises a flat plate-shaped single crystal having a (101) plane, a (−201) plane or a (001) plane as a principal surface.
[4] The method for growing a β-$Ga_2O_3$-based single crystal according to any one of [1] to [3], wherein necking in the thickness direction allows the growth of the β-$Ga_2O_3$-based single crystal without inheriting the crystal information of the vaporized material.
[5] The method for growing a β-$Ga_2O_3$-based single crystal according to any one of [1] to [3], wherein contacting the seed crystal with the $Ga_2O_3$-based melt after removing the vaporized material on the principal surface of the seed crystal in a vicinity of a bottom allows the growth of the β-$Ga_2O_3$-based single crystal without inheriting the crystal information of the vaporized material.
[6] The method for growing a β-$Ga_2O_3$-based single crystal according to any one of [1] to [3], wherein contacting the seed crystal with the $Ga_2O_3$-based melt without contacting the vaporized material on the principal surface of the seed crystal with the $Ga_2O_3$-based melt allows the growth of the β-$Ga_2O_3$-based single crystal without inheriting the crystal information of the vaporized material.

According to another embodiment of the invention, a method for producing a $Ga_2O_3$-based single crystal substrate set forth in [7] and [8] below is provided so as to achieve the above object.
[7] A method for producing a β-$Ga_2O_3$-based single crystal substrate, comprising processing the β-$Ga_2O_3$-based single crystal according to any one of [1] to [3] into a β-$Ga_2O_3$-based single crystal substrate.
[8] A method for producing a β-$Ga_2O_3$-based single crystal substrate, comprising:
 processing the β-$Ga_2O_3$-based single crystal according to any one of [1] to [3] into a second seed crystal;
 growing a second β-$Ga_2O_3$-based single crystal from the second seed crystal; and
 processing the second β-$Ga_2O_3$-based single crystal into a β-$Ga_2O_3$-based single crystal substrate.

According to another embodiment of the invention, a $Ga_2O_3$-based single crystal substrate set forth in [9] and [10] below is provided so as to achieve the above object.
[9] A β-$Ga_2O_3$-based single crystal substrate produced by the method for producing a β-$Ga_2O_3$-based single crystal substrate according to [7].
[10] A β-$Ga_2O_3$-based single crystal substrate produced by the method for producing a β-$Ga_2O_3$-based single crystal substrate according to [8].

Advantageous Effects of the Invention

According to the invention, it is possible to provide a method for growing a β-$Ga_2O_3$-based single crystal which allows obtainment of a flat plate-shaped β-$Ga_2O_3$-based single crystal having high crystal quality. Also, it is possible to provide a method for producing a β-$Ga_2O_3$-based single crystal substrate from a β-$Ga_2O_3$-based single crystal grown by the above-mentioned growth method. Also it is possible to provide a method for producing a β-Ga$_2$O$_3$-based single crystal substrate, in which the β-Ga$_2$O$_3$-based single crystal grown by the above-mentioned growth method is used as a seed (a seed crystal) and a new β-Ga$_2$O$_3$-based single crystal grown from such a seed is processed into a substrate. Furthermore, it is possible to provide β-Ga$_2$O$_3$-based single crystal substrates produced by these production methods.

BRIEF DESCRIPTION OF DRAWINGS

FIG. 4A is an illustration diagram showing a process of growing a β-Ga$_2$O$_3$-based single crystal in a first embodiment.

FIG. 4B is an illustration diagram showing the process of growing the β-Ga$_2$O$_3$-based single crystal in the first embodiment.

FIG. 4C is an illustration diagram showing the process of growing the β-Ga$_2$O$_3$-based single crystal in the first embodiment.

FIG. 5A is an illustration diagram showing a process of growing a β-Ga$_2$O$_3$-based single crystal without performing necking as Comparative Example.

FIG. 5B is an illustration diagram showing the process of growing the β-Ga$_2$O$_3$-based single crystal without performing necking as Comparative Example.

FIG. 5C is an illustration diagram showing the process of growing the β-Ga$_2$O$_3$-based single crystal without performing necking as Comparative Example.

FIG. 8 is a flowchart showing an example of a process of producing a β-Ga$_2$O$_3$-based single crystal substrate in the first embodiment.

FIG. 13A is an illustration diagram showing a process of growing a β-Ga$_2$O$_3$-based single crystal in a fourth embodiment.

FIG. 13B is an illustration diagram showing the process of growing the β-Ga$_2$O$_3$-based single crystal in the fourth embodiment.

FIG. 13C is an illustration diagram showing the process of growing the β-Ga$_2$O$_3$-based single crystal in the fourth embodiment.

DESCRIPTION OF EMBODIMENTS

First Embodiment

Figure 1:
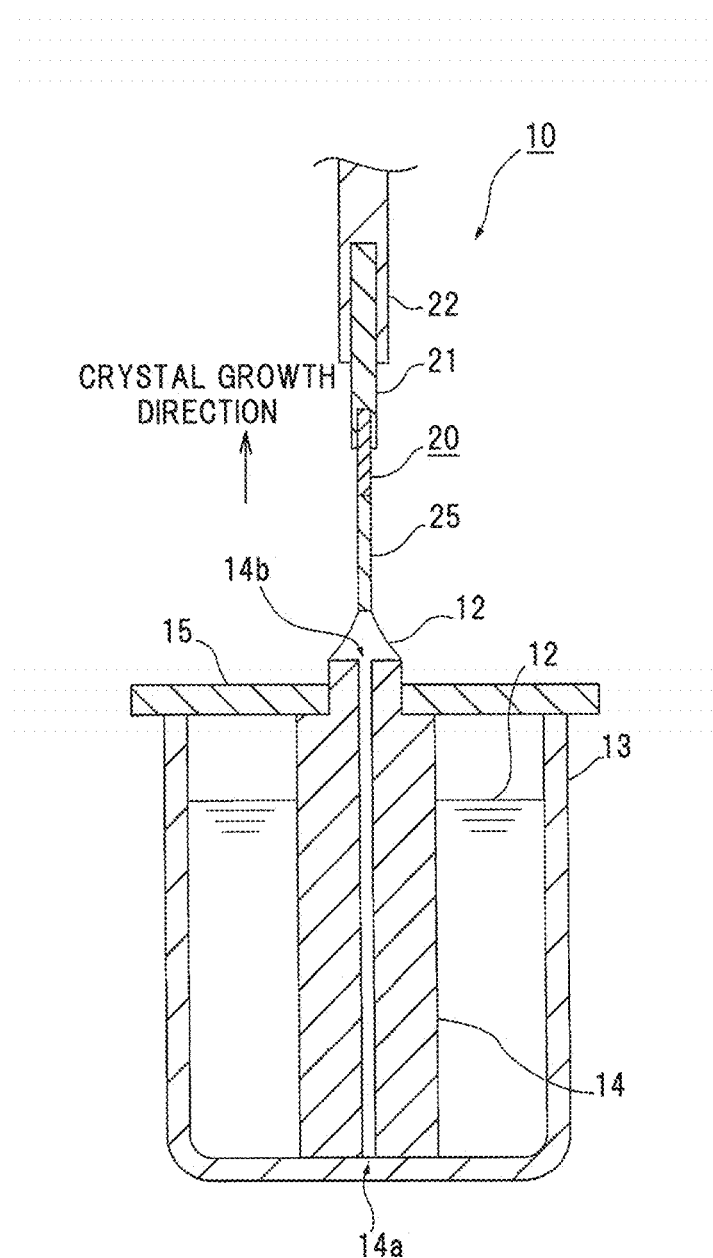
FIG. 1 is a vertical cross sectional view showing a part of an EFG crystal manufacturing apparatus in embodiments.

FIG. 1 is a vertical cross sectional view showing a part of an EFG crystal manufacturing apparatus in the embodiments. This EFG crystal manufacturing apparatus 10 has a crucible 13 containing a Ga$_2$O$_3$ melt 12, a die 14 placed in the crucible 13 and having a slit 14$a$, a lid 15 covering the upper surface of the crucible 13 except an opening 14$b$ of the slit 14$a$, a seed crystal holder 21 for holding a flat plate-shaped β-Ga$_2$O$_3$-based single crystal (hereinafter, referred as "seed crystal") 20 and a shaft 22 vertically movably supporting the seed crystal holder 21.

The crucible 13 contains the Ga$_2$O$_3$ melt 12 which is obtained by melting β-Ga$_2$O$_3$ powder. The crucible 13 is formed of a metal material having sufficient heat resistance to contain the Ga$_2$O$_3$ melt 12, such as iridium.

The die 14 has the slit 14$a$ to draw up the Ga$_2$O$_3$ melt 12 by capillary action.

The lid 15 prevents the high-temperature Ga$_2$O$_3$ melt 12 from evaporating from the crucible 13 and further prevents the vapor of the Ga$_2$O$_3$ melt 12 from attaching to a portion other than the upper surface of the slit 14$a$.

Figure 2:
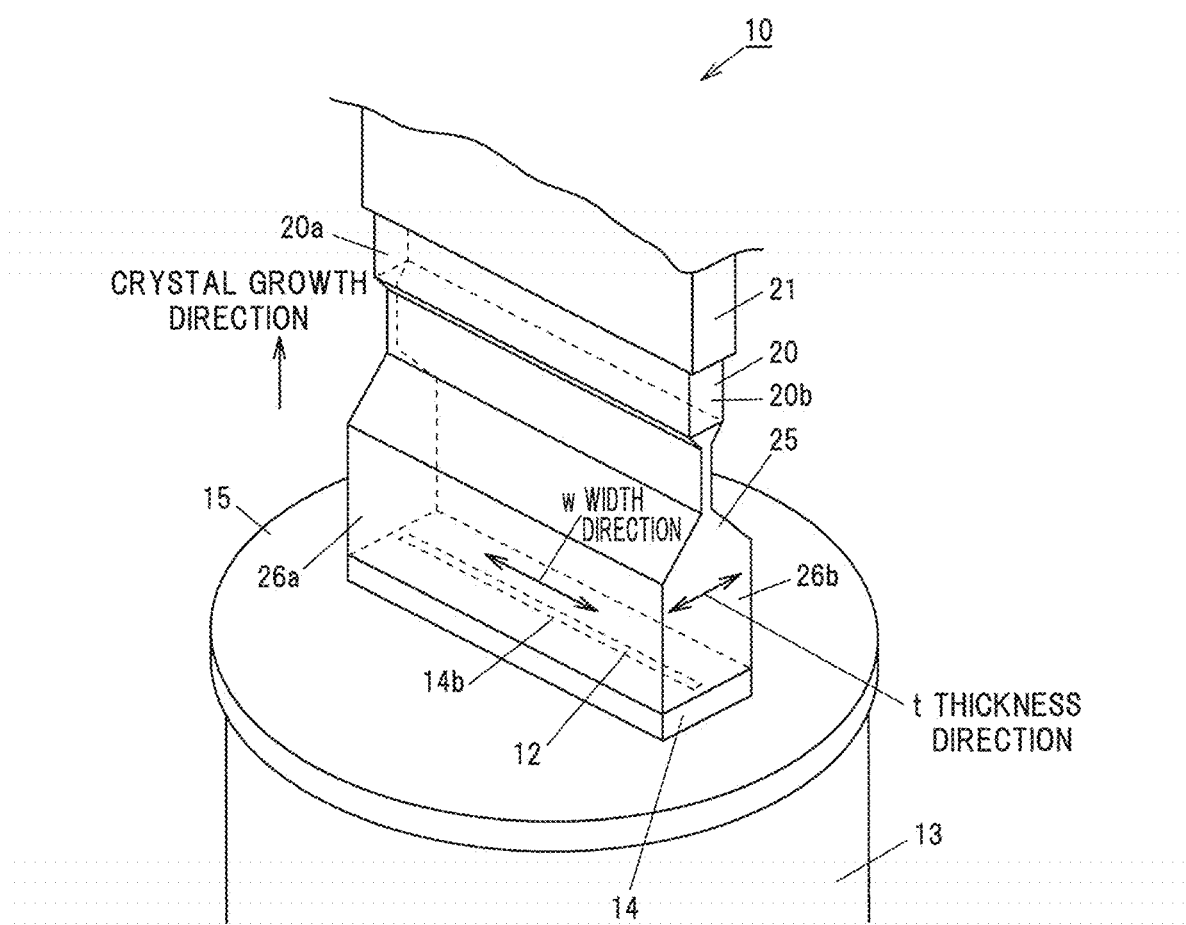
FIG. 2 is a perspective view showing a state during growth of a β-Ga$_2$O$_3$-based single crystal.

FIG. 2 is a perspective view showing a state during growth of a β-Ga$_2$O$_3$-based single crystal.

A principal surface 20$a$ is a principal surface of the flat plate-shaped seed crystal 20 and a side surface 20$b$ is a surface of the flat plate-shaped seed crystal 20 intersecting with the principal surface 20$a$. A principal surface 26$a$ is a principal surface of a flat plate-shaped portion of a β-Ga$_2$O$_3$-based single crystal 25 and a side surface 26$b$ is a surface of the flat plate-shaped portion of the β-Ga$_2$O$_3$-based single crystal 25 intersecting with the principal surface 26a.

The crystal orientation of the β-Ga$_2$O$_3$-based single crystal 25 is the same as the crystal orientation of the seed crystal 20 and, for example, the principal surface 20a of the seed crystal 20 is parallel to the principal surface 26a of the β-Ga$_2$O$_3$-based single crystal 25 and the side surface 20b of the seed crystal 20 is parallel to the side surface 26b of the β-Ga$_2$O$_3$-based single crystal 25.

When a β-Ga$_2$O$_3$ substrate is formed by cutting the flat plate-shaped portion of the grown β-Ga$_2$O$_3$-based single crystal 25, the plane orientation of the principal surface 26a of the β-Ga$_2$O$_3$-based single crystal 25 is made to coincide with the desired plane orientation of the principal surface of the β-Ga$_2$O$_3$ substrate. When forming a β-Ga$_2$O$_3$ substrate of which principal surface is e.g., a (101) plane, the plane orientation of the principal surface 26a is (101).

A direction perpendicular to the growth direction of the β-Ga$_2$O$_3$-based single crystal 25 as well as parallel to the principal surface 26a is defined as a width direction w, and a direction parallel to the thickness direction of the flat plate-shaped β-Ga$_2$O$_3$-based single crystal 25 as well as orthogonal to the width direction w is defined as a thickness direction t.

The β-Ga$_2$O$_3$-based single crystal 25 and the seed crystal 20 are β-Ga$_2$O$_3$-based single crystals, or are β-Ga$_2$O$_3$-based single crystals doped with an element such as Cu, Ag, Zn, Cd, Al, In, Si, Ge, Sn, Mg, Nb or Fe.

Figure 3:
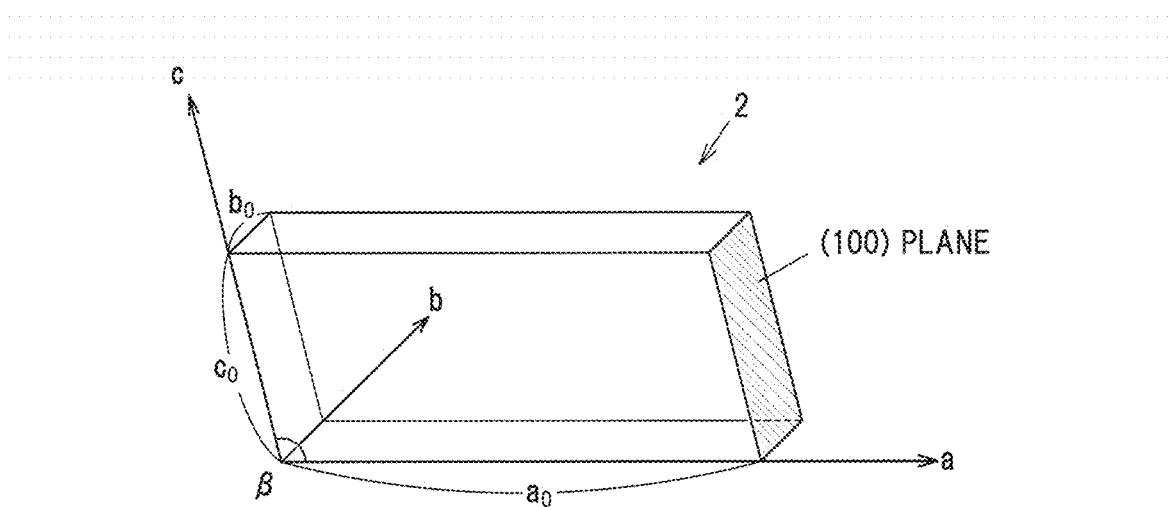
FIG. 3 is an illustration diagram showing a unit cell of the β-Ga$_2$O$_3$-based single crystal.

FIG. 3 is an illustration diagram showing a unit cell of the β-Ga$_2$O$_3$-based single crystal. A unit cell 2 in FIG. 3 is a unit cell of the β-Ga$_2$O$_3$-based single crystal. The β-Ga$_2$O$_3$ crystal has a β-gallia structure belonging to the monoclinic system and the typical lattice constants of β-Ga$_2$O$_3$ crystal not containing impurities are $a_0=12.23$ Å, $b_0=3.04$ Å, $c_0=5.80$ Å, $\alpha=\gamma=90°$ and $\beta=103.8°$.

The β-Ga$_2$O$_3$-based single crystal has high cleavability on the (100) plane, and twins with the (100) plane as a twinning plane (a plane of symmetry) are likely to be formed in the shoulder widening process during crystal growth. Therefore, to maximize the size of a substrate cut out from the β-Ga$_2$O$_3$-based single crystal 25, it is preferable to grow the β-Ga$_2$O$_3$-based single crystal 25 in the b-axis direction so that the (100) plane is parallel to the growth direction of the β-Ga$_2$O$_3$-based single crystal 25.

An example of a method of growing the β-Ga$_2$O$_3$-based single crystal 25 in the first embodiment will be described below.

The β-Ga$_2$O$_3$-based single crystal 25 is grown in, e.g., a nitrogen atmosphere or in a nitrogen/oxygen mixed atmosphere.

Firstly, the seed crystal 20 is moved down and is brought into contact with the Ga$_2$O$_3$ melt 12 which is drawn up to the opening 14b through the slit 14a of the die 14 by capillary action. Then, the seed crystal 20 in contact with the Ga$_2$O$_3$ melt 12 is pulled up, thereby growing the flat plate-shaped β-Ga$_2$O$_3$-based single crystal 25.

At this time, the β-Ga$_2$O$_3$-based single crystal 25 is grown such that the flat plate-shaped portion of the β-Ga$_2$O$_3$-based single crystal 25 does not inherit crystal information, such as crystal orientation, of the vaporized material of the Ga$_2$O$_3$ melt 12 adhered to the seed crystal 20. This is because crystal orientation of the vaporized material adhered to the seed crystal 20 is different from crystal orientation of the seed crystal 20 and this causes the β-Ga$_2$O$_3$-based single crystal 25 to have different crystal orientations in a portion inherited crystal information from the seed crystal 20 and in a portion inherited crystal information from the vaporized material, causing polycrystallization or twinning of the β-Ga$_2$O$_3$-based single crystal 25.

FIGS. 4A to 4C are illustration diagrams showing a process of growing the β-Ga$_2$O$_3$-based single crystal in the first embodiment. Especially, FIGS. 4A to 4C are side views from a direction parallel to the width direction w.

Firstly, the flat plate-shaped seed crystal 20 not containing twins is prepared. In the first embodiment, since the shoulder of the β-Ga$_2$O$_3$-based single crystal 25 is not widened in the width direction w as described later, a dimension of the seed crystal 20 in the width direction w is preferably not less than a dimension of the die 14 in the width direction w (a longitudinal width of the die 14).

Then, as shown in FIG. 4A, the seed crystal 20 is moved down and brought closer to the Ga$_2$O$_3$ melt 12 on the surface of the die 14. At this stage, a vaporized material 23 of the Ga$_2$O$_3$ melt 12 is adhered to the seed crystal 20. A descending speed of the seed crystal 20 is, e.g., 1 mm/min.

Next, as shown in FIG. 4B, the seed crystal 20 is brought into contact with the Ga$_2$O$_3$ melt 12 and is then pulled up. Standby time until pulling up the seed crystal 20 after the contact with the Ga$_2$O$_3$ melt 12 is preferably long to some extent in order to further stabilize the temperature to prevent thermal shock, and is, e.g., not less than 1 min. The vaporized material 23 on the bottom surface of the seed crystal 20 is melted and mixed with the Ga$_2$O$_3$ melt 12 when the seed crystal 20 comes into contact with the Ga$_2$O$_3$ melt 12.

When pulling up the seed crystal 20, the β-Ga$_2$O$_3$-based single crystal 25 is grown while reducing the dimension (necking) in the thickness direction t. As a result, in the β-Ga$_2$O$_3$-based single crystal 25, growth of a portion 25b inherited crystal information of the vaporized material 23 on the principal surface 20a is interrupted in the vicinity of the seed crystal 20, and only a portion 25a inherited crystal information of the seed crystal 20 keeps growing.

In order to effectively interrupt the growth of the portion 25b by necking, the dimension of the β-Ga$_2$O$_3$-based single crystal 25 to be reduced in the thickness direction t is preferably not less than 100 μm (50 μm on each side).

It is not necessary to perform the necking in the width direction w. When the dimension of the seed crystal 20 in the width direction w is not less than the dimension of the die 14 in the width direction w, the vaporized material 23 on the side surfaces 20b of the seed crystal 20 does not come into contact with the Ga$_2$O$_3$ melt 12 and crystal information of the vaporized material 23 is not inherited by the β-Ga$_2$O$_3$-based single crystal 25. Meanwhile when the vaporized material 23 on the side surfaces 20b of the seed crystal 20 comes into contact with the Ga$_2$O$_3$ melt 12, growth of the portion inherited crystal information of the vaporized material 23 on the side surfaces 20b of the seed crystal 20 is not interrupted without performing the necking in the width direction w. However, since the shoulder widening in the width direction w is not performed in the subsequent process, the volume of this portion does not increase and no significant problem occurs.

For performing the necking in the first embodiment, the shape of a free surface (meniscus) of the Ga$_2$O$_3$ melt 12 drawn up to the seed crystal 20 by surface tension is controlled by adjusting temperature. In detail, the width becomes narrower with increasing temperature of the Ga$_2$O$_3$ melt 12.

In the first embodiment, since the necking in the thickness direction t is performed but the necking in the width direction w is not performed at all or hardly performed, the seed crystal 20 is pulled up in a state that temperature of the Ga$_2$O$_3$ melt 12 is higher on a surface intersecting with the thickness direction t than on a surface intersecting with the width direction w.

Generally, necking of single crystal is performed to prevent dislocations due to defects of seed crystal. In contrast, in the first embodiment, the main purpose of the necking is to prevent the flat plate-shaped portion of the β-Ga$_2$O$_3$-based single crystal 25 from containing the portion 25b inherited crystal information of the vaporized material 23.

Then, as shown in FIG. 4C, the β-Ga$_2$O$_3$-based single crystal 25 is continuously grown while widening the shoulder thereof in the thickness direction t. At this time, the shoulder of the β-Ga$_2$O$_3$-based single crystal 25 is not widened in the width direction w.

At this time, the shoulder widening is initiated by pulling up the seed crystal 20 while gradually decreasing temperature, and the shoulder is widened in the thickness direction t until the thickness of the β-Ga$_2$O$_3$-based single crystal 25 reaches, e.g., the lateral width of the die 14. Preferably, the temperature is continuously gradually decreased until the shoulder widening begins on the entire surface intersecting with the thickness direction t.

When, for example, the β-Ga$_2$O$_3$-based single crystal 25 having a flat plate-shaped portion of, e.g., 12 mm in thickness is grown from the seed crystal 20 having a thickness of 6 mm, temperature is decreased at a rate of 1° C./min and, after a mass increase rate exceeds 2000 mg/min, a temperature reduction rate is changed to 0.15° C./min and temperature is decreased 5° C. and then kept constant. Meanwhile, when the β-Ga$_2$O$_3$-based single crystal 25 having a flat plate-shaped portion of, e.g., 18 mm in thickness is grown from the seed crystal 20 having a thickness of 12 mm, temperature is decreased at a rate of 1° C./min and, after a mass increase rate exceeds 2400 mg/min, a temperature reduction rate is changed to 0.15° C./min and temperature is decreased 5° C. and then kept constant. Then, the β-Ga$_2$O$_3$-based single crystal 25 is continuously grown to a desired size. Since the growth of the portion 25b inherited crystal information of the vaporized material 23 at least on the principal surfaces 20s of the seed crystal 20 is interrupted before widening the shoulder, the flat plate-shaped portion of the β-Ga$_2$O$_3$-based single crystal 25 formed after widening the shoulder hardly contains or does not contain a portion inherited crystal information of the vaporized material 23 at all.

FIGS. 5A to 5C are illustration diagrams showing a process of growing a β-Ga$_2$O$_3$-based single crystal without performing necking as Comparative Example.

Firstly, as shown in FIG. 5A, the seed crystal 20 is moved down and brought closer to the Ga$_2$O$_3$ melt 12 on the surface of the die 14. At this stage, the vaporized material 23 of the Ga$_2$O$_3$ melt 12 is adhered to the seed crystal 20.

Next, as shown in FIG. 5B, the seed crystal 20 is brought into contact with the Ga$_2$O$_3$ melt 12 and is then pulled up. The necking is not performed when pulling up the seed crystal 20. Therefore, in the β-Ga$_2$O$_3$-based single crystal 25, the growth of the portion 25b inherited crystal information of the vaporized material 23 is not interrupted.

Then, as shown in FIG. 5C, the β-Ga$_2$O$_3$-based single crystal 25 is continuously grown while widening the shoulder thereof in the thickness direction t. At this time, since the portion 25b keeps growing, the portion 25b is contained in a flat plate-shaped portion of the β-Ga$_2$O$_3$-based single crystal 25. This makes the volume of the portion 25a smaller than that in the first embodiment shown in FIG. 4C, causing a substrate cut out from the β-Ga$_2$O$_3$-based single crystal 25 to have a small diameter.

The reason for widening the shoulder of the β-Ga$_2$O$_3$-based single crystal 25 only in the thickness direction t without widening in the width direction w will be described below.

Figure 6A:
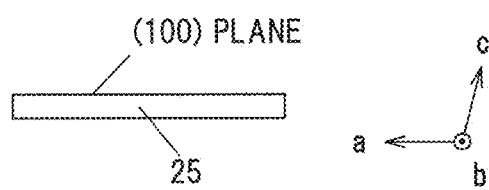
FIG. 6A is a cross sectional view showing a β-Ga$_2$O$_3$-based single crystal having a (001)-oriented principal surface when taken perpendicular to the b-axis.
Figure 6B:
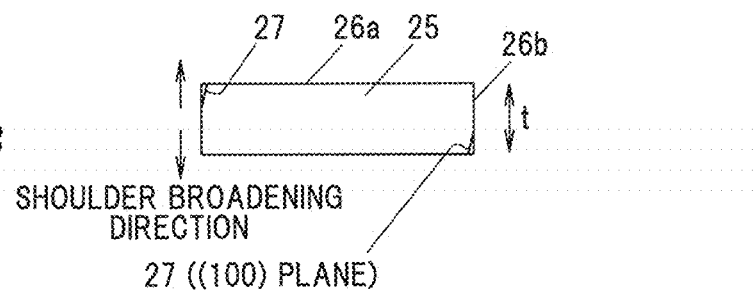
FIG. 6B is a cross sectional view showing the β-Ga$_2$O$_3$-based single crystal having a (001)-oriented principal surface when taken perpendicular to the b-axis.
Figure 6C:
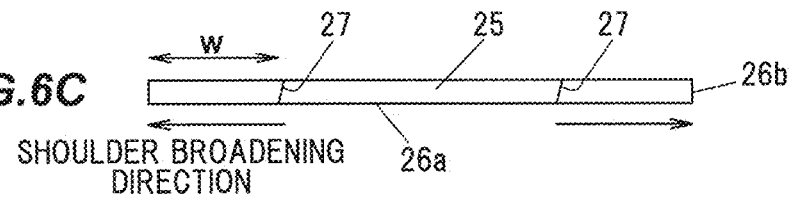
FIG. 6C is a cross sectional view showing the β-Ga$_2$O$_3$-based single crystal having a (001)-oriented principal surface when taken perpendicular to the b-axis.

FIGS. 6A to 6C are cross sectional views showing the β-Ga$_2$O$_3$-based single crystal 25 having the (001)-oriented principal surface 26a when taken perpendicular to the b-axis.

Here, FIG. 6A is a cross sectional view of the β-Ga$_2$O$_3$-based single crystal 25 before widening the shoulder. FIG. 6B is a cross sectional view of the β-Ga$_2$O$_3$-based single crystal 25 when the shoulder is widened in the thickness direction t as is in the first embodiment. FIG. 6C is a cross sectional view of the β-Ga$_2$O$_3$-based single crystal 25 when the shoulder is widened in the width direction w as Comparative Example.

Since the (001) plane is parallel to the b-axis, the flat plate-shaped β-Ga$_2$O$_3$-based single crystal 25 having the (001)-oriented principal surface 26a can be formed by growing in the b-axis direction. In the β-Ga$_2$O$_3$-based single crystal 25 grown in the b-axis direction, a (100) plane having high cleavability is present along the growth direction.

When the shoulder of the β-Ga$_2$O$_3$-based single crystal 25 is widened, the (100) plane including a corner of the pre-shoulder-widening shape is likely to become a twining plane. In the examples shown in FIGS. 6B and 6C, the (100) planes extending from the corners of the rectangle shown in FIG. 6A are twining planes 27.

As shown in FIGS. 6B and 6C, the volume of portions separated from the middle main body by the twining planes 27 is smaller when widening the shoulder in the thickness direction t than when widening the shoulder in the width direction w. When a substrate cut out from the β-Ga$_2$O$_3$-based single crystal 25 has a portion containing the twining plane 27, it cannot be used as a substrate. This means that the β-Ga$_2$O$_3$-based single crystal 25 shown in FIG. 6C having the shoulders widened in the width direction w has many unusable portions and it is understood that the volume of the portion which can be cut out is hardly increased by widening the shoulder. On the other hand, the β-Ga$_2$O$_3$-based single crystal 25 shown in FIG. 6B having the shoulders widened in the thickness direction t has only few unusable portions and it is understood that the volume of the portion which can be cut out is increased by widening the shoulder.

Figure 7A:
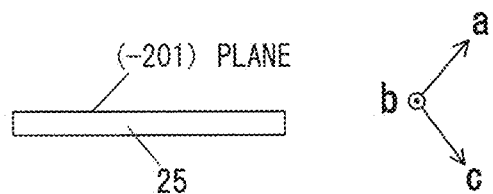
FIG. 7A is a cross sectional view showing a β-Ga$_2$O$_3$-based single crystal having a (−201)-oriented principal surface when taken perpendicular to the b-axis.
Figure 7B:
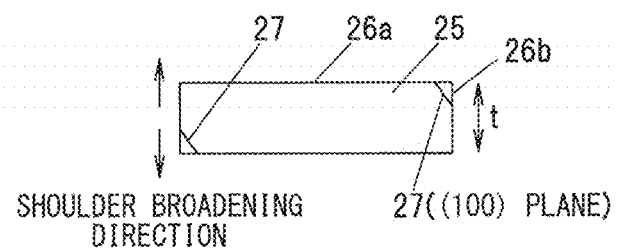
FIG. 7B is a cross sectional view showing the β-Ga$_2$O$_3$-based single crystal having a (−201)-oriented principal surface when taken perpendicular to the b-axis.
Figure 7C:
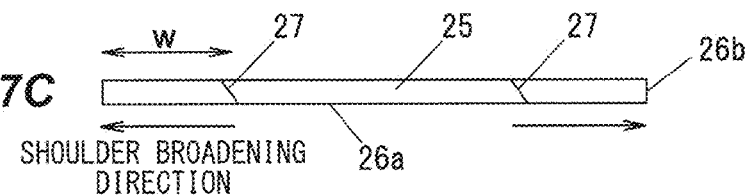
FIG. 7C is a cross sectional view showing the β-Ga$_2$O$_3$-based single crystal having a (−201)-oriented principal surface when taken perpendicular to the b-axis.

FIGS. 7A to 7C are cross sectional views showing the β-Ga$_2$O$_3$-based single crystal 25 having the (−201)-oriented principal surface 26a when taken perpendicular to the b-axis. Here, FIG. 7A is a cross sectional view of the β-Ga$_2$O$_3$-based single crystal 25 before widening the shoulder. FIG. 7B is a cross sectional view of the β-Ga$_2$O$_3$-based single crystal 25 when the shoulder is widened in the thickness direction t as is in the first embodiment. FIG. 7C is a cross sectional view of the β-Ga$_2$O$_3$-based single crystal 25 when the shoulder is widened in the width direction w as Comparative Example.

Since the (−201) plane is parallel to the b-axis, the flat plate-shaped β-Ga$_2$O$_3$-based single crystal 25 having the (−201)-oriented principal surface 26a can be formed by growing in the b-axis direction. In the β-Ga$_2$O$_3$-based single crystal 25 grown in the b-axis direction, a (100) plane having high cleavability is present along the growth direction.

In the examples shown in FIGS. 7B and 7C, the (100) planes extending from the corners of the rectangle shown in FIG. 7A are the twining planes 27. As shown in FIGS. 7B and 7C, the volume of the portions separated from the middle main body by the twining planes 27 (a portion which cannot be cut out as a substrate) is smaller when widening the shoulder in the thickness direction t than when widening the shoulder in the width direction w.

In addition, also when the principal surface 26a is oriented to (101), the flat plate-shaped β-Ga$_2$O$_3$-based single crystal 25 can be formed by growing in the b-axis direction since the (101) plane is parallel to the b-axis, in the same manner as when the principal surface 26a is oriented to (001) or (−201) as shown in FIG. 6 or 7. Also, the volume of the portions separated from the middle main body by the twining planes 27 (a portion which cannot be cut out as a substrate) is smaller when widening the shoulder of the β-Ga$_2$O$_3$-based single crystal 25 in the thickness direction t than when widening the shoulder in the width direction w.

When the β-Ga$_2$O$_3$-based single crystal 25 is grown in the b-axis direction, if the principal surface 26a intersects with the (100) plane, the volume of the portions separated from the middle main body by the twining planes 27 is smaller by widening the shoulder in the thickness direction t than when widening the shoulder in the width direction w. In other words, it is possible to reduce the volume of the portions which cannot be cut out as a substrate, and to increase the volume of the portions which can be cut out as a substrate. In this regard, to further increase the volume of the portions which can be cut out as a substrate, it is preferable that the β-Ga$_2$O$_3$-based single crystal 25 having a principal surface parallel to the b-axis such as the (001) plane, the (201) plane or the (101) plane be grown in the b-axis direction such that the (100) plane to be the twining plane 27 can be parallel to the b-axis as the growth direction.

The following is an example of a method of producing a β-Ga$_2$O$_3$-based single crystal substrate from the grown β-Ga$_2$O$_3$-based single crystal 25.

FIG. 8 is a flowchart showing an example of a process of producing a β-Ga$_2$O$_3$-based single crystal substrate. The process will be described below with the flowchart.

Firstly, the β-Ga$_2$O$_3$-based single crystal 25 having a flat plate-shaped portion of, e.g., an 18 mm in thickness is grown and is then annealed to relieve thermal stress during single crystal growth and to improve electrical characteristics (Step S1). The atmosphere used is preferably a nitrogen atmosphere but may be another inactive atmosphere such as argon or helium. Annealing holding temperature is preferably a temperature of 1400 to 1600° C. Annealing time at the holding temperature is preferably about 6 to 10 hours.

Next, the seed crystal 20 and the β-Ga$_2$O$_3$-based single crystal 25 are separated by cutting with a diamond blade (Step S2). Firstly, the β-Ga$_2$O$_3$-based single crystal 25 is fixed to a carbon stage via heat-melting wax. The β-Ga$_2$O$_3$-based single crystal 25 fixed to the carbon stage is set on a cutting machine and is cut for separation. The grit number of the blade is preferably about #200 to #600 (defined by JIS B 4131) and a cutting rate is preferably about 6 to 10 mm per minute. After cutting, the β-Ga$_2$O$_3$-based single crystal 25 is detached from the carbon stage by heating.

Next, the edge of the β-Ga$_2$O$_3$-based single crystal 25 is shaped into a circular shape by an ultrasonic machining device or a wire-electrical discharge machine (Step S3). An orientation flat(s) can be additionally formed at a desired position(s) of the edge.

Next, the circularly-shaped β-Ga$_2$O$_3$-based single crystal 25 is sliced to about 1 mm thick by a multi-wire saw, thereby obtaining a β-Ga$_2$O$_3$-based single crystal substrate (Step S4). In this process, it is possible to slice at a desired offset angle. It is preferable to use a fixed-abrasive wire saw. A slicing rate is preferably about 0.125 to 0.3 mm per minute.

Next, the β-Ga$_2$O$_3$-based single crystal substrate is annealed to reduce processing strain and to improve electrical characteristics as well as permeability (Step S5). The annealing is performed in an oxygen atmosphere during temperature rise and is performed in a nitrogen atmosphere when holding temperature after the temperature rise. The atmosphere used when holding the temperature may be another inactive atmosphere such as argon or helium. The holding temperature is preferably 1400 to 1600° C.

Next, the edge of the β-Ga$_2$O$_3$-based single crystal substrate is chamfered (or beveled) at a desired angle (Step S6).

Next, the β-Ga$_2$O$_3$-based single crystal substrate is ground to a desired thickness by a diamond abrasive grinding wheel (Step S7). The grit number of the grinding wheel is preferably about #800 to #1000 (defined by JIS B 4131).

Next, the β-Ga$_2$O$_3$-based single crystal substrate is polished to a desired thickness using a turntable and diamond slurry (Step S8). It is preferable to use a turntable formed of a metal-based or glass-based material. A grain size of the diamond slurry is preferably about 0.5 μm.

Next, the β-Ga$_2$O$_3$-based single crystal substrate is polished using a polishing cloth and CMP (Chemical Mechanical Polishing) slurry until atomic-scale flatness is obtained (Step S9). The polishing cloth formed of nylon, silk fiber or urethane, etc., is preferable. Slurry of colloidal silica is preferably used. The principal surface of the β-Ga$_2$O$_3$-based single crystal substrate after the CMP process has a mean roughness of about Ra=0.05 to 0.1 nm.

Figure 9:
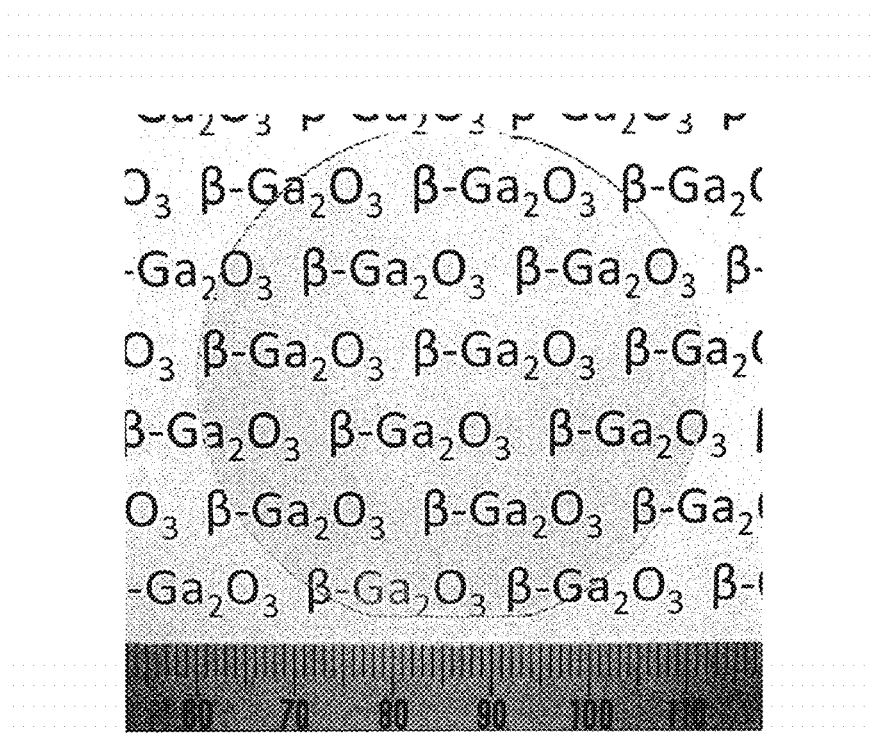
FIG. 9 is a photograph showing a β-Ga$_2$O$_3$-based single crystal substrate produced from the β-Ga$_2$O$_3$-based single crystal in the first embodiment.

FIG. 9 is a photograph showing a β-Ga$_2$O$_3$-based single crystal substrate 40 produced from the β-Ga$_2$O$_3$-based single crystal 25 through the steps described above. The β-Ga$_2$O$_3$-based single crystal substrate 40 does not contain twins and a principal surface thereof is excellent in flatness. Therefore, the see-through letters "β-Ga$_2$O$_3$" under the β-Ga$_2$O$_3$-based single crystal substrate 40 are not broken or distorted.

Another method may be used, in which a seed crystal is cut out from the grown β-Ga$_2$O$_3$-based single crystal 25, a new β-Ga$_2$O$_3$-based single crystal is grown from this seed crystal, and a β-Ga$_2$O$_3$-based single crystal substrate is produced from the new β-Ga$_2$O$_3$-based single crystal. An example of such a method will be described below.

After growing the β-Ga$_2$O$_3$-based single crystal 25 having a flat plate-shaped portion of, e.g., 18 mm in thickness, the β-Ga$_2$O$_3$-based single crystal 25 is separated from the seed crystal 20 and the β-Ga$_2$O$_3$-based single crystal 25 is cut at intervals of 20 to 40 mm along a direction perpendicular to the growth direction. Firstly, the β-Ga$_2$O$_3$-based single crystal 25 is fixed to a carbon stage via heat-melting wax. The β-Ga$_2$O$_3$-based single crystal 25 fixed to the carbon stage is set on a cutting machine and is cut with a diamond blade. The grit number of the diamond blade is preferably about #200 to #600 (defined by JIS B 4131) and a cutting rate is preferably about 6 to 10 mm per minute. After cutting, the separated seed crystal 20 and the β-Ga$_2$O$_3$-based single crystals 25 cut at intervals of 20 to 40 mm along a direction perpendicular to the growth direction are detached from the carbon stage by heating. Each of the β-Ga$_2$O$_3$-based single crystals 25 cut at intervals of 20 to 40 mm is used as a new seed crystal (hereinafter, referred to as "second seed crystal").

Next, a new β-Ga$_2$O$_3$-based single crystal (hereinafter, referred to as "second β-Ga$_2$O$_3$-based single crystal") is grown from the second seed crystal by a typical single crystal growth method, e.g., the typical EFG method. In this regard, the second β-Ga$_2$O$_3$-based single crystal is preferably grown without widening the shoulder in the width direction in the same manner as the above-mentioned growth of the β-Ga$_2$O$_3$-based single crystal 25 using the seed crystal 20.

Next, a β-Ga$_2$O$_3$-based single crystal substrate is produced from the grown second β-Ga$_2$O$_3$-based single crystal by the same method as the above-mentioned method of producing a β-Ga$_2$O$_3$-based single crystal substrate from the grown β-Ga$_2$O$_3$-based single crystal 25.

Second Embodiment

The second embodiment is different from the first embodiment in the method of preventing a flat portion of the β-Ga$_2$O$_3$-based single crystal from containing a portion inherited crystal information of the vaporized material. Note that, the explanation of the same features as those in the first embodiment will be omitted or simplified.

Figure 10A:
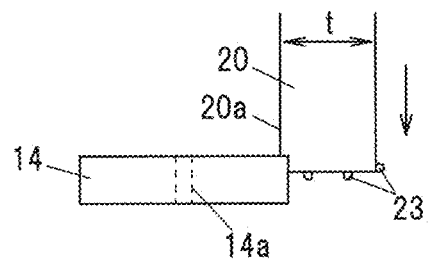
FIG. 10A is an illustration diagram showing a process of growing a β-Ga$_2$O$_3$-based single crystal in a second embodiment.
Figure 10B:
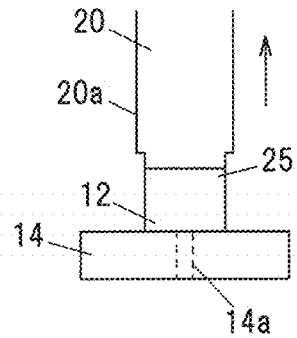
FIG. 10B is an illustration diagram showing the process of growing the β-Ga$_2$O$_3$-based single crystal in the second embodiment.
Figure 10C:
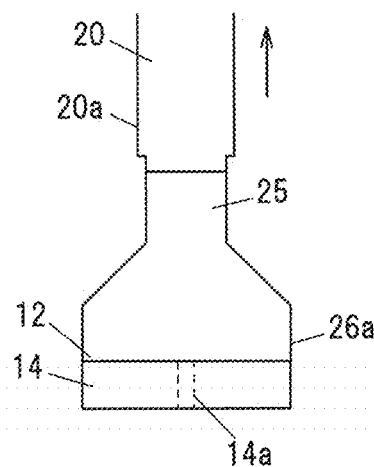
FIG. 10C is an illustration diagram showing the process of growing the β-Ga$_2$O$_3$-based single crystal in the second embodiment.

FIGS. 10A to 10C are illustration diagrams showing a process of growing a β-Ga$_2$O$_3$-based single crystal in the second embodiment. Especially, FIGS. 10A to 10C are side views from a direction parallel to the width direction w.

Firstly, the same seed crystal 20 as that in the first embodiment is prepared.

Then, as shown in FIG. 10A, the seed crystal 20 is moved down and one of the principal surfaces 20a is brought into contact with an edge of the die 14 to melt a portion in the vicinity of the bottom. Subsequently, the other principal surface 20a is processed in the same manner. As a result, the vaporized material 23 on the principal surfaces 20a in the vicinity of the bottom of the seed crystal 20 is removed.

Next, as shown in FIG. 10B, the seed crystal 20 is brought into contact with the Ga$_2$O$_3$ melt 12 on the surface of the die 14 and is then pulled up. At this time, a portion inherited crystal information of the vaporized material 23 on the principal surfaces 20a of the seed crystal 20 is not formed in the β-Ga$_2$O$_3$-based single crystal 25 since the vaporized material 23 on the principal surfaces 20 of the seed crystal 20 has been already removed.

It is not necessary to remove the vaporized material 23 on the side surfaces 20b of the seed crystal 20. When the dimension of the seed crystal 20 in the width direction w is not less than the dimension of the die 14 in the width direction w, the vaporized material 23 on the side surfaces 20b of the seed crystal 20 does not come into contact with the Ga$_2$O$_3$ melt 12 and crystal information of the vaporized material 23 is not inherited by the β-Ga$_2$O$_3$-based single crystal 25. Meanwhile, when the vaporized material 23 on the side surfaces 20b of the seed crystal 20 comes into contact with the Ga$_2$O$_3$ melt 12, a portion inherited crystal information of the vaporized material 23 is formed in the β-Ga$_2$O$_3$-based single crystal 25. However, since the shoulder widening in the width direction w is not performed in the subsequent process, the volume of this portion does not increase and no significant problem occurs.

Then, as shown in FIG. 10C, the β-Ga$_2$O$_3$-based single crystal 25 is continuously grown while widening the shoulder thereof in the thickness direction t. At this time, the shoulder of the β-Ga$_2$O$_3$-based single crystal 25 is not widened in the width direction w.

After that, the β-Ga$_2$O$_3$-based single crystal 25 is continuously grown to a desired size. Since the portion inherited crystal information of the vaporized material 23 at least on the principal surfaces 20a of the seed crystal 20 is not formed, the flat plate-shaped portion of the β-Ga$_2$O$_3$-based single crystal 25 formed after widening the shoulder hardly contains or does not contain a portion inherited crystal information of the vaporized material 23 at all.

The method of producing a β-Ga$_2$O$_3$-based single crystal substrate from the β-Ga$_2$O$_3$-based single crystal 25 is the same as that in the first embodiment. The method, in which the β-Ga$_2$O$_3$-based single crystal 25 is processed into the second seed crystal and a β-Ga$_2$O$_3$-based single crystal substrate is produced from the second β-Ga$_2$O$_3$-based single crystal grown from the second seed crystal, is also the same as that in the first embodiment.

Figure 11:
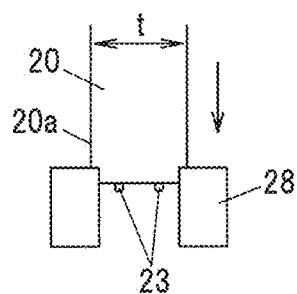
FIG. 11 is an illustration diagram showing a modification of the process of growing the β-Ga$_2$O$_3$-based single crystal in the second embodiment.

FIG. 11 is an illustration diagram showing a modification of the process of growing the β-Ga$_2$O$_3$-based single crystal in the second embodiment.

In the modification, the vaporized material 23 on the principal surfaces 20a in the vicinity of the bottom of the seed crystal 20 is removed using a specialized tool 28, as shown in FIG. 11. The tool 28 is composed of, e.g., two linear members. The seed crystal 20 is moved down and the principal surfaces 20a on the both sides are brought into contact with edges of the tool 28 to melt portions in the vicinity of the bottom. As a result, the vaporized material 23 on the principal surfaces 20a in the vicinity of the bottom of the seed crystal 20 is removed. The subsequent steps are the same as those in the second embodiment.

Third Embodiment

The third embodiment is different from the first embodiment in the method of preventing a flat plate-shaped portion of the β-Ga$_2$O$_3$-based single crystal from containing a portion inherited crystal information of the vaporized material. Note that, the explanation of the same features as those in the first embodiment will be omitted or simplified.

Figure 12A:
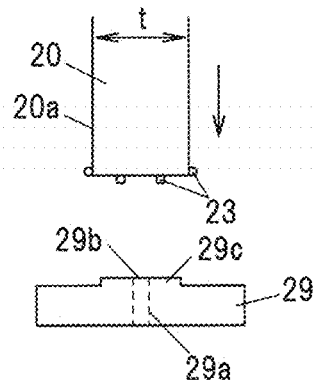
FIG. 12A is an illustration diagram showing a process of growing a β-Ga$_2$O$_3$-based single crystal in a third embodiment.
Figure 12B:
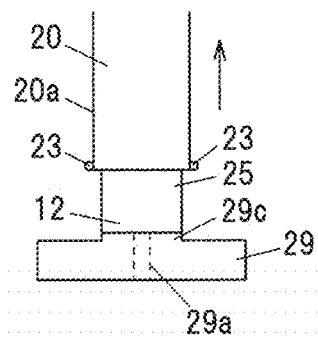
FIG. 12B is an illustration diagram showing the process of growing the β-Ga$_2$O$_3$-based single crystal in the third embodiment.
Figure 12C:
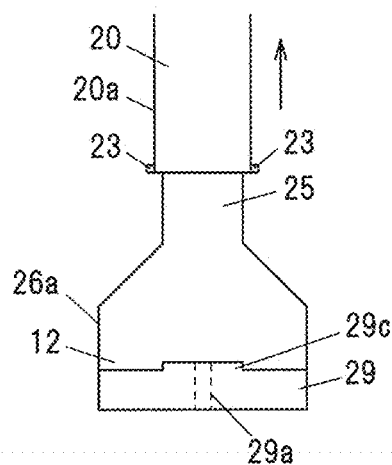
FIG. 12C is an illustration diagram showing the process of growing the β-Ga$_2$O$_3$-based single crystal in the third embodiment.

FIGS. 12A to 12C are illustration diagrams showing a process of growing a β-Ga$_2$O$_3$-based single crystal in the third embodiment. Especially, FIGS. 12A to 12C are side views from a direction parallel to the width direction w.

Firstly, the same seed crystal 20 as that in the first embodiment is prepared. A die 29 in the third embodiment has a raised shape in which a portion including an opening 29b of a slit 29 protrudes from the upper surface, and a dimension of a raised portion 29c of the raised shape in the thickness direction t is not more than the dimension of the seed crystal 20 in the thickness direction t.

Then, as shown in FIG. 12A, the seed crystal 20 is moved down and brought closer to the Ga$_2$O$_3$ melt 12 on the surface of the die 29. At this stage, the vaporized material 23 of the Ga$_2$O$_3$ melt 12 is adhered to the seed crystal 20.

Then, as shown in FIG. 12B, the seed crystal 20 is brought into contact with the Ga$_2$O$_3$ melt 12 on the surface of the raised portion 29c and is then pulled up. At this time, since the dimension of the raised portion 29c in the thickness direction t is not more than the dimension of the seed crystal 20 in the thickness direction t and the seed crystal 20 thus comes into contact with only the Ga$_2$O$_3$ melt 12 on the surface of the raised portion 29c, the vaporized material 23 on the principal surfaces 20a of the seed crystal 20 does not come into contact with the Ga$_2$O$_3$ melt 12. Therefore, a portion inherited crystal information of the vaporized material 23 on the principal surfaces 20a of the seed crystal 20 is not formed in the β-Ga$_2$O$_3$-based single crystal 25.

When the dimension of the seed crystal 20 in the width direction w is not less than the dimension of the die 29 in the width direction w, the vaporized material 23 on the side surfaces 20b of the seed crystal 20 also does not come into contact with the Ga$_2$O$_3$ melt 12 and crystal information of the vaporized material 23 is not inherited by the β-Ga$_2$O$_3$-based single crystal 25. Meanwhile, when the vaporized material 23 on the side surfaces 20b of the seed crystal 20 comes into contact with the $Ga_2O_3$ melt 12, a portion inherited crystal information of the vaporized material 23 is formed in the β-$Ga_2O_3$-based single crystal 25. However, since the shoulder widening in the width direction w is not performed in the subsequent process, the volume of this portion does not increase and no significant problem occurs.

Then, as shown in FIG. 12C, the β-$Ga_2O_3$-based single crystal 25 is continuously grown while widening the shoulder thereof in the thickness direction t. At this time, the β-$Ga_2O_3$-based single crystal 25 is grown also from the $Ga_2O_3$ melt 12 on the surface of the die 29 in a region on both sides of the raised portion 29c while controlling a pulling-up speed or temperature. The shoulder of the β-$Ga_2O_3$-based single crystal 25 is not widened in the width direction w.

After that, the β-$Ga_2O_3$-based single crystal 25 is continuously grown to a desired size. Since the portion inherited crystal information of the vaporized material 23 at least on the principal surfaces 20a of the seed crystal 20 is not formed, the flat plate-shaped portion of the β-$Ga_2O_3$-based single crystal 25 formed after widening the shoulder hardly contains or does not contain a portion inherited crystal information of the vaporized material 23 at all.

The method of producing a β-$Ga_2O_3$-based single crystal substrate from the β-$Ga_2O_3$-based single crystal 25 is the same as that in the first embodiment. The method, in which the β-$Ga_2O_3$-based single crystal 25 is processed into the second seed crystal and a β-$Ga_2O_3$-based single crystal substrate is produced from the second β-$Ga_2O_3$-based single crystal grown from the second seed crystal, is also the same as that in the first embodiment.

Fourth Embodiment

The fourth embodiment is different from the first embodiment in the method of preventing a flat plate-shaped portion of the β-$Ga_2O_3$-based single crystal from containing a portion inherited crystal information of the vaporized material. Note that, the explanation of the same features as those in the first embodiment will be omitted or simplified.

FIGS. 13A to 13C and 14A to 14C are illustration diagrams showing a process of growing a β-$Ga_2O_3$-based single crystal in the fourth embodiment. Especially, FIGS. 13A to 13C and 14A to 14C are side views from a direction parallel to the width direction w.

Firstly, the same seed crystal 20 as that in the first embodiment is prepared. A die 30 in the fourth embodiment has slits 30a. The die 30 preferably has plural slits 30a, for the reasons described later.

Then, as shown in FIG. 13A, the seed crystal 20 is moved down and brought closer to the $Ga_2O_3$ melt 12 on the surface of the die 30. At this stage, the vaporized material 23 of the $Ga_2O_3$ melt 12 is adhered to the seed crystal 20.

Then, as shown in FIG. 13B, the seed crystal 20 is brought into contact with the $Ga_2O_3$ melt 12 on the surface of the die 30.

Next, as shown in FIG. 13C, in a state that the seed crystal 20 is in contact with the surface of the die 30, the seed crystal 20 is slid to a position at which the vaporized material 23 on one of the principal surfaces 20a of the seed crystal 20 does not contact with the die 30. At this time, it is preferable to slide the seed crystal 20 substantially horizontally.

Figure 14A:
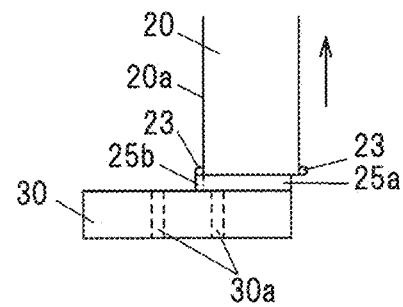
FIG. 14A is an illustration diagram showing the process of growing the β-Ga$_2$O$_3$-based single crystal in the fourth embodiment.

Next, as shown in FIG. 14A, the seed crystal 20 is pulled up. At this time, a crystal grows from the vaporized material 23 on the principal surface 20a in contact with the die 30 and produces the portion 25b inherited crystal information of the vaporized material 23, but a crystal does not grow from the vaporized material 23 on the other principal surface 20a which is not in contact with the die 30. Here, the seed crystal 20 is pulled up to a height of, e.g., several millimeters.

Figure 14B:
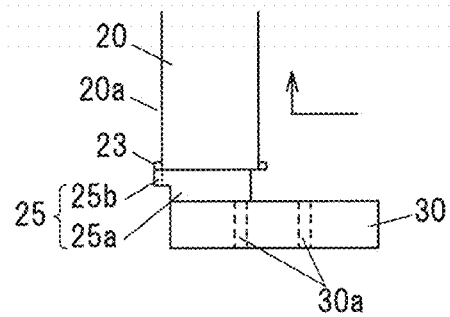
FIG. 14B is an illustration diagram showing the process of growing the β-Ga$_2$O$_3$-based single crystal in the fourth embodiment.

Next, as shown in FIG. 14B, after sliding the seed crystal 20 in a direction opposite to the sliding direction in the step shown in FIG. 13C up to a position at which the portion 25b does not contact with the die 30 (a position at which the vaporized material 23 on the other principal surface 20a of the seed crystal 20 is out of a region immediately above the die 30), the seed crystal 20 is pulled up. At this time, it is preferable to slide the seed crystal 20 substantially horizontally. Also, the seed crystal 20 is pulled up to a height of, e.g., several millimeters.

Figure 14C:
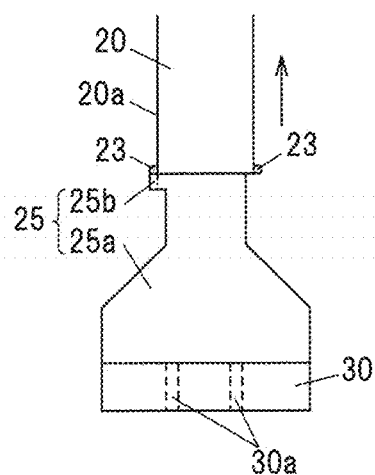
FIG. 14C is an illustration diagram showing the process of growing the β-Ga$_2$O$_3$-based single crystal in the fourth embodiment.

Next, as shown in FIG. 14C, after sliding back to above the position in the vicinity of the center of the die 30 in the thickness direction t, the β-$Ga_2O_3$-based single crystal 25 is grown by pulling up while widening the shoulder thereof in the thickness direction t. The shoulder of the β-$Ga_2O_3$-based single crystal 25 is not widened in the width direction w.

After that, the β-$Ga_2O_3$-based single crystal 25 is continuously grown to a desired size. Since the portion inherited crystal information of the vaporized material 23 at least on the principal surface 20a of the seed crystal 20 is not formed, the flat plate-shaped portion of the β-$Ga_2O_3$-based single crystal 25 formed after widening the shoulder hardly contains or does not contain a portion inherited crystal information of the vaporized material 23 at all.

When pulling up the seed crystal 20 in the steps shown in FIGS. 14A to 14C, the seed crystal 20 is preferably located immediately above the slit 30a in order to efficiently grow the crystal. For this reason, the slits 30a are preferably arranged in a wide range and the die 30 thus preferably has plural slits 30a. In this case, the seed crystal 20 only needs to be located immediately above at least one slit 30a.

Even when the seed crystal 20 has a distance from the surface of the die 30 before the step of sliding the seed crystal 20 shown in FIG. 13C and crystals grow from the vaporized material 23 on the both principal surfaces 20a of the seed crystal 20, it is possible to interrupt crystal growth of the portion inherited information of the vaporized material 23 located out of the region immediately above the die 30, as is in the step shown in FIG. 14B, by sliding the seed crystal 20 to the position at which the vaporized material 23 on one of the principal surfaces 20a is out of the region immediately above the die 30.

In other words, in the fourth embodiment, the seed crystal 20 is pulled up at least once at the position at which the vaporized material 23 on one of the principal surfaces 20a of the seed crystal 20 is out of the region immediately above the die 30, and then, the seed crystal 20 is pulled up again at least once at the position at which vaporized material 23 on the other principal surface 20a is out of the region immediately above the die 30.

The method of producing a β-$Ga_2O_3$-based single crystal substrate from the β-$Ga_2O_3$-based single crystal 25 is the same as that in the first embodiment. The method, in which the β-$Ga_2O_3$-based single crystal 25 is processed into the second seed crystal and a β-$Ga_2O_3$-based single crystal substrate is produced from the second β-$Ga_2O_3$-based single crystal grown from the second seed crystal, is also the same as that in the first embodiment.

Effects of the Embodiments

In the first to fourth embodiments, by growing the flat plate-shaped β-$Ga_2O_3$-based single crystal 25 so as not to inherit crystal information of the vaporized material 23 of the $Ga_2O_3$ melt 12 adhered to the seed crystal 20, it is possible to suppress twinning and polycrystallization in the flat plate-shaped portion of the β-$Ga_2O_3$-based single crystal 25 which is formed after widening the shoulder. Therefore, it is possible to produce a large-area β-$Ga_2O_3$-based single crystal substrate from the β-$Ga_2O_3$-based single crystal 25.

In addition, by widening the shoulder of the β-$Ga_2O_3$-based single crystal only in the thickness direction t when growing the β-$Ga_2O_3$-based single crystal 25 having the principal surface 26a intersecting with the (100) plane having high cleavability, it is possible to reduce volume of a portion separated by a twinning plane formed due to the shoulder widening and to increase volume of a portion which can be cut out as a substrate. Therefore, it is possible to cut out many β-$Ga_2O_3$-based single crystal substrates from the β-$Ga_2O_3$-based single crystal 25.

Although the embodiments of the invention have been described above, the invention according to claims is not to be limited to the above-mentioned embodiments. For example, although an example of using the EFG method to grow a β-$Ga_2O_3$-based single crystal has been described in the embodiments, another method may be used. For example, a pulling-down method such as micro-PD (pulling-down) method may be used. Also, the β-$Ga_2O_3$-based single crystal may be grown by the Bridgman method combined with a die having a slit as is the die 14 in the embodiments.

Further, please note that all combinations of the features described in the embodiments are not necessary to solve the problem of the invention.

INDUSTRIAL APPLICABILITY

Provided are a method for growing a β-$Ga_2O_3$-based single crystal that allows obtainment of a flat plate-shaped β-$Ga_2O_3$-based single crystal having high crystal quality, a β-$Ga_2O_3$-based single crystal substrate and a method for producing the substrate.

REFERENCE SIGNS LIST

12: $Ga_2O_3$ BASED MELT
20: SEED CRYSTAL
23: VAPORIZED MATERIAL
25: β-$Ga_2O_3$-BASED SINGLE CRYSTAL
t: THICKNESS DIRECTION
w: WIDTH DIRECTION

The invention claimed is:
1. A method for growing a β-$Ga_2O_3$-based single crystal, comprising:
   contacting a flat plate-shaped seed crystal with a $Ga_2O_3$-based melt; and
   pulling up the seed crystal such that a flat plate-shaped β-$Ga_2O_3$-based single crystal comprising a principal surface that intersects a (100) plane is grown without inheriting a crystal information of a vaporized material of the $Ga_2O_3$-based melt adhered to the principal surface of the seed crystal, wherein, when growing the β-$Ga_2O_3$-based single crystal, a shoulder of the β-$Ga_2O_3$-based single crystal is widened in a thickness direction thereof and not widened in a width direction thereof.

2. The method for growing a β-$Ga_2O_3$-based single crystal according to claim 1, wherein the β-$Ga_2O_3$-based single crystal is grown in a b-axis direction.

3. The method for growing a β-$Ga_2O_3$-based single crystal according to claim 2, wherein the β-$Ga_2O_3$-based single crystal comprises a flat plate-shaped single crystal having a (101) plane, a (−201) plane or a (001) plane as the principal surface.

4. The method for growing a β-$Ga_2O_3$-based single crystal according to claim 1, wherein necking in the thickness direction allows the growth of the β-$Ga_2O_3$-based single crystal without inheriting the crystal information of the vaporized material.

5. The method for growing a β-$Ga_2O_3$-based single crystal according to claim 1, wherein contacting the seed crystal with the $Ga_2O_3$-based melt after removing the vaporized material on the principal surface of the seed crystal in a vicinity of a bottom allows the growth of the β-$Ga_2O_3$-based single crystal without inheriting the crystal information of the vaporized material.

6. The method for growing a β-$Ga_2O_3$-based single crystal according to claim 1, wherein contacting the seed crystal with the $Ga_2O_3$-based melt without contacting the vaporized material on the principal surface of the seed crystal with the $Ga_2O_3$-based melt allows the growth of the β-$Ga_2O_3$-based single crystal without inheriting the crystal information of the vaporized material.

7. A method for producing a β-$Ga_2O_3$-based single crystal substrate, comprising processing the β-$Ga_2O_3$-based single crystal according to claim 1 into a β-$Ga_2O_3$-based single crystal substrate.

8. A method for producing a β-$Ga_2O_3$-based single crystal substrate, comprising:
   processing the β-$Ga_2O_3$-based single crystal according to claim 1 into a second seed crystal;
   growing a second β-$Ga_2O_3$-based single crystal from the second seed crystal; and
   processing the second β-$Ga_2O_3$-based single crystal into a β-$Ga_2O_3$-based single crystal substrate.

9. The method for growing a β-$Ga_2O_3$-based single crystal according to claim 2, wherein necking in the thickness direction allows the growth of the β-$Ga_2O_3$-based single crystal without inheriting the crystal information of the vaporized material.

10. The method for growing a β-$Ga_2O_3$-based single crystal according to claim 3, wherein necking in the thickness direction allows the growth of the β-$Ga_2O_3$-based single crystal without inheriting the crystal information of the vaporized material.

11. The method for growing a β-$Ga_2O_3$-based single crystal according to claim 2, wherein contacting the seed crystal with the $Ga_2O_3$-based melt after removing the vaporized material on the principal surface of the seed crystal in a vicinity of a bottom allows the growth of the β-$Ga_2O_3$-based single crystal without inheriting the crystal information of the vaporized material.

12. The method for growing a β-$Ga_2O_3$-based single crystal according to claim 3, wherein contacting the seed crystal with the $Ga_2O_3$-based melt after removing the vaporized material on the principal surface of the seed crystal in a vicinity of a bottom allows the growth of the β-$Ga_2O_3$-based single crystal without inheriting the crystal information of the vaporized material.

13. The method for growing a β-$Ga_2O_3$-based single crystal according to claim 2, wherein contacting the seed crystal with the $Ga_2O_3$-based melt without contacting the vaporized material on the principal surface of the seed crystal with the $Ga_2O_3$-based melt allows the growth of the β-$Ga_2O_3$-based single crystal without inheriting the crystal information of the vaporized material.

14. The method for growing a β-$Ga_2O_3$-based single crystal according to claim 3, wherein contacting the seed crystal with the $Ga_2O_3$-based melt without contacting the vaporized material on the principal surface of the seed crystal with the $Ga_2O_3$-based melt allows the growth of the $\beta$-$Ga_2O_3$-based single crystal without inheriting the crystal information of the vaporized material.

15. A method for producing a $\beta$-$Ga_2O_3$-based single crystal substrate, comprising processing the $\beta$-$Ga_2O_3$-based single crystal according to claim 2 into a $\beta$-$Ga_2O_3$-based single crystal substrate.

16. A method for producing a $\beta$-$Ga_2O_3$-based single crystal substrate, comprising processing the $\beta$-$Ga_2O_3$-based single crystal according to claim 3 into a $\beta$-$Ga_2O_3$-based single crystal substrate.

17. A method for producing a $\beta$-$Ga_2O_3$-based single crystal substrate, comprising:
  processing the $\beta$-$Ga_2O_3$-based single crystal according to claim 2 into a second seed crystal;
  growing a second $\beta$-$Ga_2O_3$-based single crystal from the second seed crystal; and
  processing the second $\beta$-$Ga_2O_3$-based single crystal into a $\beta$-$Ga_2O_3$-based single crystal substrate.

18. A method for producing a $\beta$-$Ga_2O_3$-based single crystal substrate, comprising:
  processing the $\beta$-$Ga_2O_3$-based single crystal according to claim 3 into a second seed crystal;
  growing a second $\beta$-$Ga_2O_3$-based single crystal from the second seed crystal; and
  processing the second $\beta$-$Ga_2O_3$-based single crystal into a $\beta$-$Ga_2O_3$-based single crystal substrate.

* * * * *